United States Patent
You

(10) Patent No.: US 11,011,180 B2
(45) Date of Patent: May 18, 2021

(54) AUDIO SIGNAL DYNAMIC RANGE COMPRESSION

(71) Applicant: Guoguang Electric Company Limited, Guangzhou (CN)

(72) Inventor: Yuli You, Laguna Beach, CA (US)

(73) Assignee: Guoguang Electric Company Limited, Guangzhou (CN)

( * ) Notice: Subject to any disclaimer, the term of this patent is extended or adjusted under 35 U.S.C. 154(b) by 0 days.

(21) Appl. No.: 16/022,819

(22) Filed: Jun. 29, 2018

(65) Prior Publication Data

US 2020/0005802 A1    Jan. 2, 2020

(51) Int. Cl.
   *G10L 19/025*    (2013.01)
   *G10L 19/26*    (2013.01)

(52) U.S. Cl.
   CPC ............ *G10L 19/025* (2013.01); *G10L 19/26* (2013.01)

(58) Field of Classification Search
   None
   See application file for complete search history.

(56) References Cited

U.S. PATENT DOCUMENTS

| | | | | |
|---|---|---|---|---|
| 6,380,726 B1* | 4/2002 | Szabo | ..................... | G01R 15/09 324/115 |
| 6,757,396 B1 | 6/2004 | Allred | | |
| 2006/0233408 A1* | 10/2006 | Kates | ................... | H04R 25/356 381/321 |
| 2012/0163629 A1* | 6/2012 | Seefeldt | ................. | H03G 9/005 381/104 |
| 2012/0321096 A1 | 12/2012 | Crockett | | |
| 2014/0294200 A1* | 10/2014 | Baumgarte | ........... | G10L 19/008 381/107 |
| 2016/0336015 A1* | 11/2016 | Pandey | ................ | H04R 25/353 |

FOREIGN PATENT DOCUMENTS

JP    H06-164275    6/1994

OTHER PUBLICATIONS

D. Giannoulis, M. Massberg, and J. Reiss. 2012, "Digital Dynamic Range Compressor Design—A Tutorial and Analysis," Journal of Audio Engineering Society 60: pp. 399-408.
Rane Corporation, 2005, "Dynamic Processors—Technology & Application Tips".
D. Giannoulis, M. Massberg, and J. Reiss, 2013, "Parameter Automation in a Dynamic Range Compressor." Journal of the Audio Engineering Society, 716-726.
Extended European search report, dated Jun. 14, 2019, in corresponding European patent application No. 18206155.
Office Action dated Jun. 30, 2020, in corresponding Japanese Patent Application No. 2018-210888.

* cited by examiner

*Primary Examiner* — Antim G Shah
(74) *Attorney, Agent, or Firm* — Joseph G Swan, PC

(57) ABSTRACT

Provided are systems, methods and techniques for compressing the dynamic range of an audio signal. In one implementation: an input audio signal is obtained, and a time-varying gain signal is provided based on it and a desired output range. The time-varying preliminary gain signal is then applied to the input audio signal to provide an output audio signal. Provision of the time-varying gain signal involves lowpass filtering a signal that is based on the input audio signal, using an attack gain-response time and a release gain-response time as filtering parameters, with the attack gain-response time decreased and the release gain-response time increased in response to a determination that a transient is occurring in the input audio signal.

20 Claims, 2 Drawing Sheets

AUDIO SIGNAL DYNAMIC RANGE COMPRESSION

FIELD OF THE INVENTION

The present invention pertains, among other things, to systems, methods and techniques related to dynamic compression of the range of an audio signal (e.g., from the signal's minimum level to its maximum level) and can be used, e.g., to boost the volume of an audio signal while better preventing or limiting audible distortion and/or damage to output devices such as speakers or headphones, as well as to generally improve a listening experience.

BACKGROUND

The dynamic ranges of certain audio passages sometimes are much wider than what the available output device, such as a loudspeaker, can accurately or clearly produce. For example, the reproduced sound might be inaudible when the audio signal is low and clipped or overloaded when the audio signal is high. Someone watching a movie might need to turn down the volume during loud scenes and turn up the volume during quiet scenes.

Dynamic range compression attempts to address these problems. It refers to a category of technologies for reducing the dynamic range of audio signals to fit playback devices and/or situational requirements. A review of such technologies is given in D. Giannoulis, M. Massberg, and J. Reiss. 2012, "Digital Dynamic Range Compressor Design—A Tutorial and Analysis," Journal of Audio Engineering Society 60: pp. 399-408 (which is referred to herein as "Giannoulis 2012").

One conventional implementation is dynamic range compressor (DRC) 5 shown in FIG. 1. There, Abs module 10 performs an absolute value operation and Log module 12 performs a logarithmic function. In a more-specific implementation, Log module 12 converts input values into decibels, as follows:

$$X_G(n) = 20 \log_{10}(|x(n)|),$$

where $x(n)$ denotes the input signal and $X_G(n)$ denotes the converted signal at the n-th sampling period.

The gain computer 14 then implements static range compression, e.g., as follows (from Giannoulis 2012):

$$Y_G = \begin{cases} X_G, & X_G - T < -W/2 \\ X_G + \left(\dfrac{1}{R} - 1\right)\dfrac{(X_G - T + W/2)^2}{2W}, & |X_G - T| \le W/2, \\ T + \dfrac{X_G - T}{R}, & X_G - T > W/2 \end{cases} \quad \text{Equation 1}$$

where T, R and W are a specified threshold, compression ratio, and knee width, respectively. As used herein, the term "static" refers to modification of individual input values without reference to other input values (i.e., input values at other points in time). Other implementations of gain computer 14 are possible, such as any of those given in Rane Corporation, 2005, "Dynamic Processors—Technology & Application Tips" (which is referred to herein as "Rane 2005"), e.g., including a combination of the foregoing compression with an expander and limiter.

As shown in FIG. 1, the output of the gain computer 14 is then subtracted from its input, in subtractor 15, to obtain the following negative gain signal:

$$X_L = X_G - Y_G \quad \text{Equation 2}$$

which is input into level detector 16 for essentially applying a smoothing operation to $X_L$ so as to obtain a smooth representation of the signal's level. There are many possible implementations of level detector 16, including any those described in Giannoulis 2012. In one specific example, level detector 16 performs the following operation:

$$Y_1(n) = \max(X_L(n), \alpha_R Y_1(n-1) + (1-\alpha_R)X_L(n))$$

$$Y_L(n) = \alpha_A Y_L(n-1) + (1-\alpha_A)Y_1(n) \quad \text{Equation 3}$$

where $Y_1(n)$ is an internal state, and $\alpha_A$ and $\alpha_R$ are the attack and release poles of the respective first-order infinite impulse response (IIR) filters. These poles control the level of smoothness of $Y_L(n)$ or how fast $Y_L(n)$ responds to changes in $X_L(n)$. Each is related to a $\tau$, a corresponding time constant (TC), as follows:

$$\alpha = e^{-1/\tau f_s}, \quad \text{Equation 4}$$

where $f_s$ is the sampling frequency. In other words:

$$\alpha_A = e^{-1/\tau_A f_s}$$

$$\alpha_R = e^{-1/\tau_R f_s}$$

where $\tau_A$ and $\tau_R$ are the attack and release TCs, respectively.

After smoothing in level detector 16, in adder 18 a make-up gain 19 (M) is added to the negative of the smoothed negative gain, and the result then is converted by the exponential function module 20 to linear scale, e.g., as follows:

$$K(n) = 10^{0.05(M - Y_L(n))}$$

This linear gain is then applied to the (optionally delayed) input signal, in multiplier 21, to produce the output signal, as follows:

$$y(n) = K(n)x(n-\tau),$$

where $\tau$ is an optional delay provided by the optional delay unit 22, which may be used to match the delay within the gain calculation side chain 30 and and/or to provide side chain 30 the ability to "look even further ahead" (e.g., in order to "prime" the DRC 5 to better cope with powerful attacks). However, in some embodiments delay unit 22 is omitted entirely.

As will be readily appreciated from the discussion above, a DRC typically multiplies an input signal with a gain that varies with time, so it performs an operation that introduces distortion into the signal. To keep such distortion low and, ideally, inaudible, large TCs should be used so that the gain changes slowly. Such large TCs work well for quasi-stationary segments of an audio signal, but usually run into problems with transient attacks, or sudden powerful bursts of sounds, such as might be produced by percussive instruments or explosions. When such a powerful attack arrives, the slow gain change produced by large TCs cannot reduce the gain fast enough to prevent the attack from exceeding the upper end of the desired range. As a result, the audio signal might clip in the digital domain (resulting in distortion), the power amplifier might overload (potentially damaging it), and/or the voice coil of the loudspeaker might strike its back plate (potentially damaging the speaker). All of these situations result in annoying sounds and, in some cases, potentially cause damage. It is, therefore, desirable to adapt the TCs to the dynamic varying nature of the input signal, e.g., so as to: (1) allow for fast gain reduction during powerful attacks and (2) provide more slowly varying gains during quasi-stationary segments.

Some attempts have been made in this regard. For instance, D. Giannoulis, M. Massberg, and J. Reiss, 2013, "Parameter Automation in a Dynamic Range Compressor." Journal of the Audio Engineering Society, 716-726 (which is referred to herein as "Giannoulis 2013") employs a transient or attack detector to differentiate between transient and quasi-stationary segments of the input signal, and then uses shorter TCs for transient segments and longer TCs for quasi-stationary segments. Typically, such conventional approaches use "standard" attack and release TCs during quasi-stationary segments. For example, during quasi-stationary segments, the attack TC might be 50-100 milliseconds (ms), and the release TC (often 10 times as large) might be 500-1,000 ms. Then, when a transient is detected, these values typically are reduced by a factor of 10 or so, i.e., with the attack TC reduced to 5-10 ms and with the release TC reduced to 50-100 ms.

SUMMARY OF THE INVENTION

Unfortunately, while the conventional straightforward approach of using short attack and release TCs during transient attacks and long attack and release TCs during quasi-stationary segments might have seemed intuitively logical, the present inventor has discovered that too often such an approach does not in fact provide good results. The present invention addresses this problem, e.g., by adjusting the TCs, or other measures of how quickly the gain is allowed to change (sometimes referred to herein as the "gain-response times"), differently than has been done in the past.

Thus, one embodiment of the invention is directed to compressing the dynamic range of an audio signal, e.g., in which: an input audio signal is obtained; a time-varying gain signal is provided based on the input audio signal and a desired output range; and the time-varying gain signal is applied to the input audio signal to provide an output audio signal. Provision of the time-varying gain signal in this embodiment includes: (i) determining and providing an indication of whether a transient is occurring in the input audio signal, (ii) providing an attack gain-response time (e.g., an attack exponential time constant) and a release gain-response time (e.g., a release exponential time constant) based on the indication of whether a transient is occurring in the input audio signal, and (iii) lowpass filtering a signal that is based on the input audio signal, using the attack gain-response time and the release gain-response time as filtering parameters. The attack gain-response time is decreased and the release gain-response time is increased in response to a determination that a transient is occurring in the input audio signal. Preferably, the attack gain-response time primarily controls how fast the strength of the output audio signal is allowed to increase in response to a sudden increase in strength of the input audio signal, and the release gain-response time primarily controls how fast the strength of the output audio signal is allowed to decrease in response to a sudden decrease in strength of the input audio signal.

As discussed in greater detail below, the indication of whether a transient is occurring in the input audio signal preferably is provided as the value of an attack function, which also indicates a measure of intensity of any detected transient. Preferably, the attack gain-response time decreases more and the release gain-response time increases more as a result of a larger measure of intensity of a detected transient.

An attack function according to the present invention can be implemented in a variety of different ways, including any one or any combination of the following: (1) based on a crest factor detector that uses peak values; (2) based on a strength of the input audio signal in comparison to a specified threshold; and/or (3) as an incremental value, by first determining preliminary attack values and then calculating the incremental value as an amount of change between a previous one of the preliminary attack values and a current one of the preliminary attack values. The input audio signal may be frame-based, e.g., with the indication of whether a transient is occurring in the input audio signal being determined for individual frames of the input audio signal, or non-frame-based, with the indication of whether a transient is occurring being determined on a sample-by-sample basis.

In the preferred embodiments, generation of the time-varying gain signal also includes identifying gains that would achieve a desired static range compression (e.g., using a piecewise linear mapping of input audio-signal values).

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

For ease of reference, the present disclosure is divided into sections. The general subject matter of each section is indicated by that section's heading. However, such headings are included simply for the purpose of facilitating readability and are not intended to limit the scope of the invention in any manner whatsoever.

General Structure of the Preferred Embodiments

Figure 1:
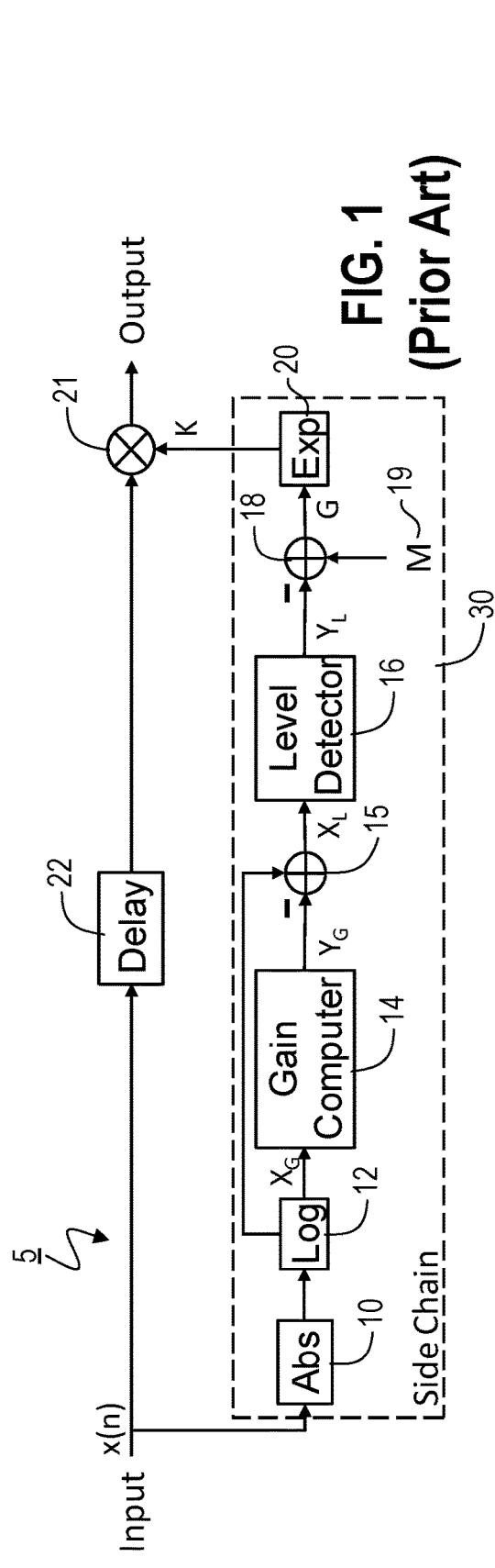
FIG. 1 is a block diagram of a conventional dynamic range compressor (DRC).
Figure 2:
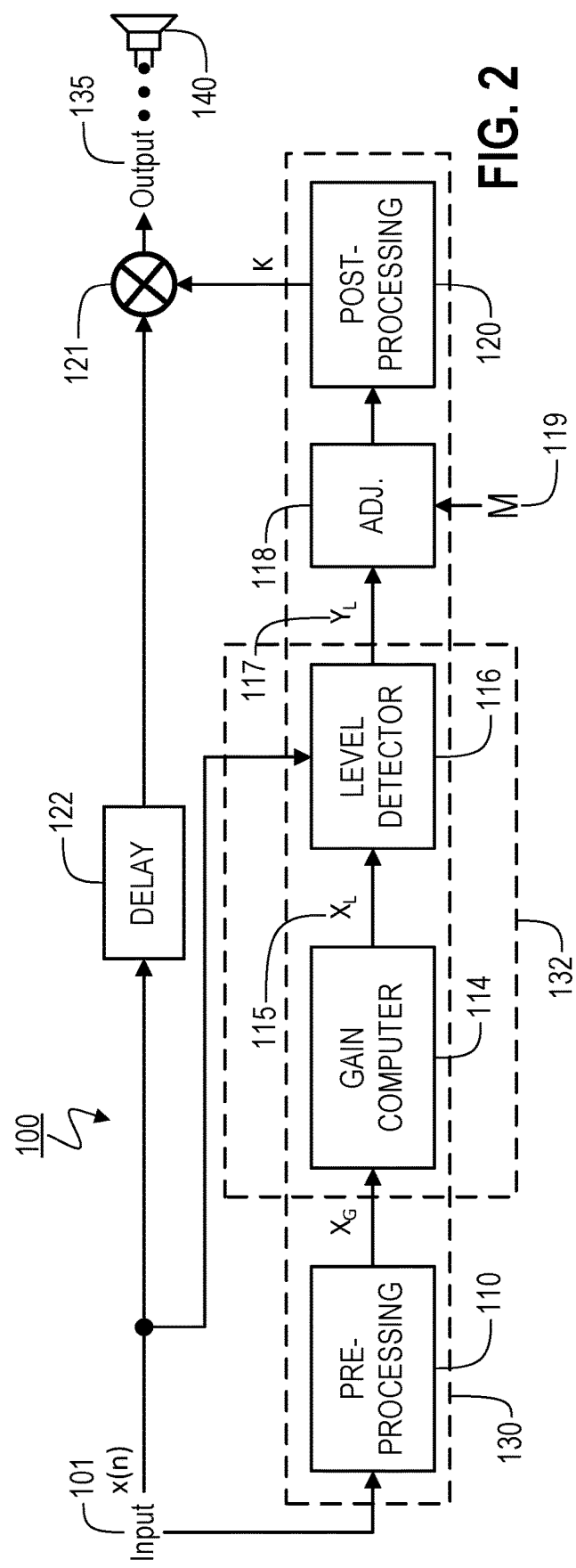
FIG. 2 is a block diagram of a DRC according to the present invention.

One example of a DRC 100 according to the present invention is illustrated in FIG. 2. As shown, DRC 100 inputs a signal 101, designated as x(n). Optionally, input signal 101 is coupled to a module 110, in which it is pre-processed, e.g., by being subject to a logarithmic function which could be similar or identical to the function implemented by the combination of conventional modules 10 and 12, discussed above. Alternatively, or in addition, any other pre-processing can be performed in optional pre-processing module 110. For example, in alternate embodiments a logarithmic transformation is not performed, but instead the input signal 101 is processed in the linear domain, e.g., to reduce computational loads. Input signal 101 (with or without any optional pre-processing 110) is then coupled to gain computer 114 which processes its input signal (designated as $X_G(n)$), typically by providing static gain compression to fit its range to a desired output range (e.g., as described above in connection with gain computer 14, such as the specific static gain compression set forth in Equation 1). The output of gain computer 114 preferably is a preliminary gain signal 115 indicating the instantaneous gain which could be applied at each corresponding point in time (typically, discrete time) to achieve the desired range compression. For example, similar to the conventional implementation discussed above, in certain embodiments gain computer 114 also performs an operation that is similar or identical to Equation 2, so that the output of gain computer 114 (preliminary gain signal 115) is a negative gain signal. In other embodiments, the gain computer 114 provides a positive gain signal. In any event, preliminary gain signal 115, which is designated as $X_L(n)$, is coupled to level detector 116, for smoothing and, in certain embodiments, other adjustments (e.g., as described in greater detail below), resulting in a smoothed gain signal 117, which is designated as $Y_L(n)$.

Thereafter, any additional adjustments, if desired, are made to the smoothed gain signal 117 ($Y_L(n)$) in optional module 118, e.g., based on one or more input parameters 119 (collectively designated as M). Parameter(s) 119, if provided, may be input manually and/or may be provided by another automated system. Module 118, if used, may implement, e.g., an addition function (typically where logarithmic values are involved) or a multiplication function (typically where linear values are involved). Finally, any desired post-processing, typically the reverse of that applied in module 110, is applied in module 120 in order to provide a linear gain factor, which is designated as K(n), and which is then used (by multiplier 121) to multiply the input signal 101, or after signal 101 has been optionally delayed within optional delay element 122 (e.g., having the same considerations discussed above in reference to delay element 22, as well as the additional considerations discussed in this section). That is, multiplier 121 preferably multiplies by the original input signal 101 by a time-varying factor that is reflective of the smoothed gain. Accordingly, its operation can be implemented through direct multiplication of such input signal 101. Alternatively, in alternate embodiments, a logarithmic operation is performed on the input signal 101, and the multiplier 121 inputs the logarithmic gain and adds it to or subtracts it from (depending upon whether the generated gain signal represents negative or positive gains) the logarithm of the input signal 101. In still further embodiments, the instantaneous gain determined in side chain 130 instead is applied to the input signal 101 in any of a variety of other ways (e.g., depending upon the nature of the gain signal).

In the present embodiment, the output 135 of multiplier 121 is the desired dynamically range-compressed output signal, which is designated as y(n) and typically is coupled, either directly or indirectly (e.g., through additional processing modules, usually including at least digital-to-analog conversion) to an output device 140 (such as a loudspeaker). Although DRC 100 is one example of a DRC according to the present invention, any of a variety of other DRC structures may be used in accordance with the present invention, as will be readily apparent from the discussion below.

One significant aspect of the current embodiment of the present invention is the way in which a preliminary gain signal 115 is adjusted (e.g., in level detector 116) to better adapt to the instantaneous characteristics of the input audio signal 101 and thereby achieve a better combination of improved results and reduced distortion. In embodiments where the conventional system 5 (described above) is being modified, such an adjustment preferably is achieved by better controlling the TCs that are used (e.g., within level detector 116) for different portions of the audio signal (115). As also noted elsewhere herein, in alternate embodiments of the level detector 116 and gain computer 114 are reversed, so that the smoothing is applied to a version of the input signal 101 prior to determining gains based on it.

In any event, the foregoing aspect of the present invention concerns techniques for better controlling any desired gain-response times (i.e., irrespective of whether or not pertaining to any exponential time constant), with shorter gain-response times meaning that gains are allowed to change more quickly and with longer gain-response times meaning that gains can only change more slowly. The following discussion mainly focuses on improvements to the conventional system described above and, therefore, frequently refers to TCs. It should be understood, however, that any references herein to one or more TCs can be replaced by references to any other gain-response time(s). That is, the approaches discussed herein are not limited to TCs, but instead may be applied in a straightforward manner to the setting of any other gain-response times, however defined.

Figure 3:
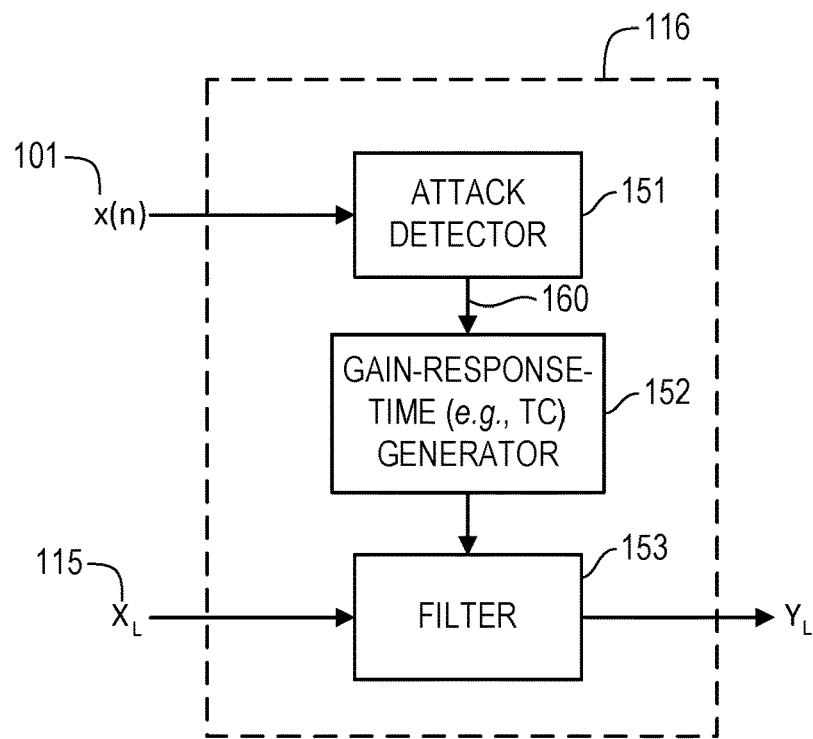
FIG. 3 is a block diagram of a level detector according to the present invention.

Somewhat similar to level detector 16, discussed above, a level detector 116 according to the present invention preferably is configured as illustrated in FIG. 3. As shown, the input signal 101 is coupled to an attack detection module 151 of level detector 116. In module 151, an attack value a(n) preferably is determined for each sample of the input signal 101, indicating the potential presence of an attack or, more preferably, the strength (e.g., measure of intensity) of any potential attack, as discussed in greater detail below. This attack value is coupled to the input of gain-response time (e.g., TC) generation module 152, which preferably then generates attack and release TCs based on it, again as discussed in greater detail below. In the preferred embodiments, the attack TC is the main factor in influencing (e.g., primarily controls) how quickly the strength of the output audio signal (e.g., output signal 135) is allowed to increase in response to a sudden increase in strength of the input signal 101 (e.g., how quickly the system will ramp up suppression of the input signal 101 in the apparent presence of an transient attack), while the release TC is the main factor influencing (e.g., primarily controls) how quickly the strength of the output audio signal is allowed to decrease in response to a sudden decrease in strength of the input audio signal (e.g., how quickly the system will return to a quasi-stationary gain after the transient appears to have ended).

Such TCs preferably are then coupled to, and used by, a filter 153 having another input coupled to the preliminary gain signal 115. In the preferred embodiments, filter 153 is a lowpass filter, e.g., implementing a filtering operation such as defined in Equation 3 above, with a variable transfer function that is controlled by the TCs output by gain-response-time generator 152. Thus, other (more-specific) significant aspects of the present invention are: (1) the manner in which the TCs are generated and (2) because such TCs are based on them, how the attack values are determined. Therefore, a significant portion of the following discussion focuses on these two features.

With regard to the filtering operation performed by filter 153, a short attack TC enables rapid gain reduction, thereby preventing powerful attacks from exceeding a specified maximum. However, attacks in audio signals usually do not reach their peak power in the first rising quarter of a sinusoidal cycle in which the amplitude increases, so it will be followed by at least one falling quarter in which the amplitude decreases. Then the magnitude begins to increase again in a subsequent quarter. Using conventional approaches, this can be problematic. For instance, with respect to the example given in the Background section above, as can be seen from Equation 3, whenever the magnitude is less than the projected internal state $Y_1(n)$, the releasing mechanism kicks in, which increases the gain. As a result, the gain reduction desired for coping with the powerful attack that will arrive in subsequent quarter(s) will have already been negated. The shorter the release TC, the greater this negating effect is. In one aspect, therefore, the present invention lessens this negating effect by using:

Longer release TCs during transient attacks; and
Shorter or normal release TCs during quasi-stationary segments.

Figure 4:
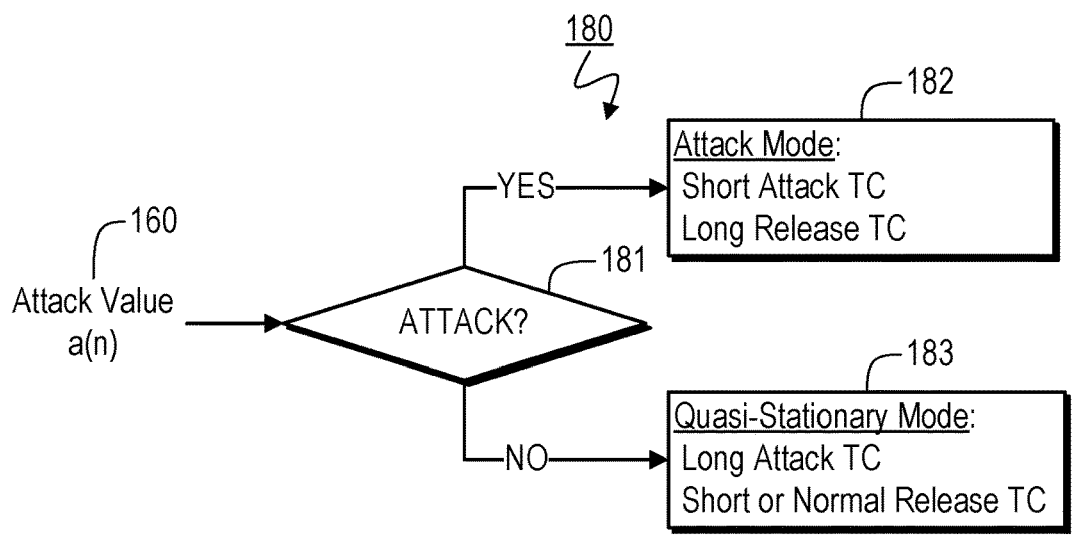
FIG. 4 is a flow diagram showing an example of the determination of time constants for use in a level detector according to the present invention.

More preferably, as shown in FIG. 4, a system 100 according to the present invention preferably implements a process 180 that essentially involves two operational modes (preferably selected via the generation of corresponding TCs in the gain-response-time generation module 152 of the level detector 116), as follows:

During periods of time when a transient attack has been determined to be occurring (in step 181, e.g., based on an attack value 160 provided by detector 151), the DRC enters attack mode (step 182) in which (relative to the quasi-stationary segments) shorter attack and longer release TCs are used.

During other times (quasi-stationary segments, as determined in step 181, e.g., based on an attack value 160 provided by detector 151), the DRC enters quasi-stationary mode (step 183) in which (relative to the transient segments) longer attack and shorter or normal release TCs are used.

As already discussed above, these modes 182 and 183 need not be separated and clearly distinct, but instead in certain embodiments can represent different portions of a continuum, distinguished only by a threshold value, e.g., where the attack function is continuous in value.

That is, unlike conventional approaches in which both attack and release TCs move in the same direction (shorter during attacks and longer during quasi-stationary segments), in the preferred embodiments of the present invention, they move in opposite directions (with attack TCs being shorter when a transient has been detected and longer during quasi-stationary segments, but with release TCs being longer when a transient has been detected and shorter during quasi-stationary segments). Thus, somewhat similar to the conventional techniques described in the Background section above, an approach according to the present invention might reduce the attack TC from 50-100 ms during a quasi-stationary segment to 0-5 or 0-10 ms for a segment during which a transient has been detected. However, in stark contrast to the conventional techniques, an approach according to the present invention might increase the release TC from 50-1,000 ms during a quasi-stationary segment to at least 500 ms, 1 second, 2 seconds, 4 seconds or even infinity (i.e., by a factor of at least 5, 10, 20, 40 or even infinity) for a segment during which a transient has been detected.

For this purpose, it initially is desirable to determine when a transient is occurring. The present embodiment contemplates several different embodiments in this regard. However, it generally is preferred that any function used for this purpose (i.e., an attack function) satisfies the following requirement:

$$a(n)\begin{cases} > 1, & \text{attack modes;} \\ = 1, & \text{quasi-stationary modes} \end{cases} \quad \text{Equation 5}$$

where $a(n)$ is the attack function, with larger values of $a(n)$ indicating a stronger (or more intense) transient.

One example of such an attack function is based on the crest factor detector presented in Giannoulis 2013, but replacing its use of RMS values with peak values, so as to arrive at the following crest factor detector:

$$Y_{Peak}(n) = \max(|x(n)|, \alpha_c Y_{Peak}(n-1) + (1-\alpha_c)|x(n)|) \quad \text{Equation 6}$$

$$Y_{Abs}(n) = \alpha_c Y_{Abs}(n-1) + (1-\alpha_c)|x(n)|$$

$$c(n) = \frac{Y_{Peak}(n)}{\sqrt{2}\, Y_{Abs}(n)}$$

where $c(n)$ is the crest factor (which, e.g., can be directly used as $a(n)$) and $\alpha_c$ is a pole which can be derived from a TC $\tau_c$ using Equation 4. Preferably, $\tau_c$ is chosen based on the normal attack TC. For example, if the normal attack TC=20 ms, $\tau_c$ also may be chosen to be 20 ms.

In any event, once a value has been determined for the attack function $a(n)$, the $\tau_A(n)$ and $\tau_R(n)$ TCs can then be determined. One approach to doing so is as follows:

$$\tau_A(n) = \begin{cases} \tau_A^{Long}, & a(n) < T_a \\ \tau_A^{Short}, & \text{otherwise} \end{cases} \quad \text{Equation 7}$$

$$\tau_R(n) = \begin{cases} \tau_R^{Short}, & a(n) < T_a \\ \tau_R^{Long}, & \text{otherwise} \end{cases}$$

where $\tau_a$ is a specified threshold which preferably depends on the attack function and is chosen experimentally, using listening tests. As noted above, release TCs usually are much longer than attack TCs, so the short release TC ($\tau_R^{Short}$) above may be much longer than the long attack TC ($\tau_A^{Long}$). The specific values for the time constants $\tau_A^{Long}$, $\tau_A^{Short}$, $\tau_R^{Short}$ and $\tau_R^{Long}$ preferably are selected from the ranges discussed above for the present invention, but other values may be selected for certain circumstances.

Alternatively, if continuously varying TCs are desired, they can be determined using a soft decision-making mechanism, such as the following:

$$\tau_A(n) = \frac{\tau_A^{max}}{a(n)} \quad \text{Equation 8}$$

$$\tau_R(n) = a(n)\tau_R^{min}$$

where $\tau_A^{max}$ is the maximum (quasi-stationary) attack TC, and $\tau_R^{min}$ is the minimum (quasi-stationary) release TC, and where such constants can, e.g., fall within the ranges noted above ($50 \leq \tau_A^{max} \leq 100$ ms and $100 \leq \tau_R^{min} \leq 1{,}000$ ms). However, any other functions that decrease $\tau_A(n)$ and increase $\tau_R(n)$ as $a(n)$ increases instead may be used. Preferably, the specific functions that are used depend upon how $a(n)$ is defined because changes in either such functions or in a(n) can affect how quickly the subject TCs respond to an attack having a particular intensity.

The foregoing discussion mainly concerns a particular embodiment of the present invention. However, as discussed throughout this disclosure, many different embodiments are possible. Each typically will employ attack and release gain-response times (e.g., time constants) in order to generate a time-varying gain signal, which is then applied to the input audio signal (e.g., input signal 101) to provide an output audio signal (e.g., output signal 135). Such a gain signal often will have different characteristics (i.e., having been generated differently) in different embodiments (e.g., reflecting either positive or negative gains, defined as linear or logarithmic gains, etc.) and, therefore, the way the gain signal is applied to the input signal typically will vary correspondingly.

The following sections discuss various alternative embodiments, e.g., employing different attack functions.

Power-Based Attack Functions.

Another type of attack function a(n) that can be used in the present invention is based on the power of the input signal, e.g., deciding to enter attack mode based on a determination that the signal's power (or, more generally, strength) is higher than a specified threshold (i.e., based on a comparison of the strength of the input signal 101 in comparison to a specified threshold), such as the threshold T used in Equation 1. The simplest power detector looks at the absolute value of the input signal. For example, in order to comply with Equation 5, such an attack function may be defined as:

$$a(n) = \max\left\{1, \frac{|x(n)|}{T_P}\right\}, \qquad \text{Equation 9}$$

where $T_P$ is a threshold that is related to the compression threshold. While the L^1 norm is used in the equation above, in alternate embodiments the L^2 norm and/or another norm instead (or also) is used. As indicated above, use of the term "power" or "energy" in reference to a signal herein does not imply any specific definition, unless clearly indicated otherwise in the specific context in which such term is used, but instead generally refers to the "strength" of the signal, which may be measured in any of a variety of different ways (e.g., absolute value, square of absolute value, or any of a variety of functions of the foregoing).

One potential issue with the foregoing attack function arises from the fact that its value changes with each sample. As a result, the TCs sometimes can change dramatically between samples. While this usually does not cause problems (e.g., due to the presence of level detector 116), a certain degree of smoothing may be applied within the attack function itself. For example, the usual one-pole filter can be used for this purpose:

$$s(n)=\alpha s(n-1)+(1-\alpha)|x(n)|, \qquad \text{Equation 10}$$

where s(n) is the smoothed power detector and can be used in place of |x(n)| in Equation 9 to provide the attack function. However, such a smoothing operation introduces additional delay, which preferably also is accommodated within the delay block 122.

If the crest factor in Equation 6 is used and the absolute value of the input sample is used as the power detector, Equation 10 becomes the same as the second equation of Equation 6. Therefore, $Y_{Abs}(n)$ may be used directly to construct the attack function, e.g., as follows:

$$a(n) = \max\left\{1, \frac{|Y_{Abs}(n)|}{T_P}\right\} \qquad \text{Equation 11}$$

Because the negative gain $X_L(n)$ defined in Equation 2 is always greater than or equal to zero dB and its calculation involves a thresholding mechanism, it can be used directly as an attack function, i.e.:

$$a(n)=X_L(n). \qquad \text{Equation 12}$$

The smoothed version of it, $Y_L(n)$, is suitable for situations where smoothing is desired, i.e.:

$$a(n)=Y_L(n). \qquad \text{Equation 13}$$

It is noted that, while $X_L(n)$ and $Y_L(n)$ are used above, any other form of negative compression gain instead may be used in any form of DRC.

Incremental Attack Functions.

One potential problem with the attack functions described above is that the DRC will still be in attack mode even after the peak of an attack has passed, i.e., after the attack function has reached its maximum and has started to decrease. This problem can be remedied by using an incremental attack function such as the following:

$$a_{Inc}(n) = \frac{a(n)}{a(n-1)} \qquad \text{Equation 14}$$

which can be based on any of the other attack functions described herein and which ensures that the attack function is greater than one only on the rising side of an attack.

Power-Gated Crest Factor.

As may be seen from Equation 6, the crest factor is not dependent on the power of the input signal. Therefore, using it directly as the attack function will cause the DRC to enter attack mode even in situations where the signal power is too low for the DRC to incur compression. In order to prevent this from happening, a power detector may be added to modify the attack-function value (e.g., reset it to 1) when the signal power is low. One specific example (which also uses an incremental crest factor) is as follows:

$$a(n) = c_{PG}(n) = \begin{cases} \dfrac{c(n)}{c(n-1)}, & a'(n) > T_P; \\ 1, & \text{otherwise;} \end{cases} \qquad \text{Equation 15}$$

where a'(n) is a power-based attack function, such as any of the power-based attack functions discussed above.

Alternatively, rather than using an incremental crest factor as above, an incremental power threshold may be used to ensure that the DRC enters attack mode only on the rising edge of an attack, e.g.:

$$a(n) = c'_{PG}(n) = \begin{cases} c(n), & a'(n) > T_P \text{ and } a'(n-1) < \dfrac{a'(n)}{T_{PD}}; \\ 1, & \text{otherwise;} \end{cases} \qquad \text{Equation 16}$$

where $T_{PD}$ is a specified threshold corresponding to a minimum power increment. If Equation 12 or Equation 13 is used as the power detector a'(n), the power thresholding (a'(n)>$T_P$) is performed in Equation 1, and therefore can be dropped in the equation above to give $$a(n) = c'_{PG}(n) = \begin{cases} c(n), & a'(n-1) < \dfrac{a'(n)}{T_{PD}}. \\ 1, & \text{otherwise.} \end{cases} \quad \text{Equation 17}$$

Frame-Based Attack Functions.

Frame-based processing is widely used to implement audio processing algorithms. When algorithmic testing and decision-making can be based on a fixed number of samples within a frame, more robust results often can be obtained.

Let N denote the number of samples in a frame, the sample index n may be represented as $$n = kN + m$$

where k is the frame index and m is the sample index within a frame, resulting in the following representations:

$$a(n) = a^k(m)$$

$$c(n) = c^k(m)$$

$$X_L(n) = X_L^k(m)$$

$$Y_L(n) = Y_L^k(m)$$

The maximum, mean, median, or other statistic measure of a variable within a frame may be selected as the value to represent the whole frame for that variable. Using the maximum as an example, the attack function and crest factor values for the k-th frame may be defined as $$A^k = \max_{0 \le m < N} a^k(m)$$

$$C^k = \max_{0 \le m < N} c^k(m)$$

In certain embodiments, these values are then used to decide whether to enter the attack mode or the quasi-stationary mode for the whole frame, thus to determine the respective TCs for all samples in the frame.

For example, the incremental attack function of Equation 14 may be modified for the k-th frame in a frame-based system as follows:

$$A_{Inc}^k = \frac{A^k}{A^{k-1}}.$$

If a smoothing operation is involved with the calculation of attack function values of $a^k(n)$, $A^{k-1}$ may be replaced by the last sample of the attack function in the previous frame, as follows:

$$A_{Inc}^k = \frac{A^k}{a^{k-1}(N-1)}. \quad \text{Equation 18}$$

The crest factor given in Equation 6 and the attack function in Equation 13 are well-suited for such a definition.

Because $Y_L(n)$ in Equation 13 is a smoothed version of $X_L(n)$ in Equation 12, the $A^k$ in Equation 18 may be replaced by the maximum of $X_L(n)$ in the frame so that $$A_{Inc}^k = \frac{\max_{0 \le m < N} X_L^k(m)}{Y_L^{k-1}(N-1)}.$$

The power-gated incremental crest factor defined in Equation 15 may be modified for a frame as $$C_{PG}^k = \begin{cases} \dfrac{C^k}{C^{k-1}}, & A^k > T_P \\ 1, & \text{otherwise} \end{cases}$$

where the $A^k$ preferably are determined using a power-based attack function, such as one derived from any of Equations 9-13. The power-gated incremental crest factor defined in Equation 16 may also be modified for a frame as $$A^k = C_{PG}^k = \begin{cases} C^k, & A'^k > T_P \text{ and } A'^{k-1} < \dfrac{A'^k}{T_{PD}}. \\ 1, & \text{otherwise} \end{cases}$$

If Equation 12 or Equation 13 is used as the energy detector (A'), the power thresholding ($A'^k > T_P$) is performed in Equation 1, so the above equation may be simplified as:

$$C_{PG}^k = \begin{cases} C^k, & A'^{k-1} < \dfrac{A'^k}{T_{PD}}. \\ 1, & \text{otherwise.} \end{cases}$$

Because the energy detector in Equation 13 is a smoothed version of that in Equation 12, they can be combined to form the following power-gated crest factor:

$$A^k = C_{PG}^k = \begin{cases} C^k, & Y_L^{k-1}(N-1) < \dfrac{\max_{0 \le m < N} X_L^{k-1}(m)}{T_{PD}} \\ 1, & \text{otherwise} \end{cases}$$

The attack functions obtained above may be used to make the decision as to whether or not the DRC enters attack or quasi-stationary mode for the whole frame, thus to determine respective TCs for all samples in the frame. For example, Equation 7 may be modified for frame-based processing as:

$$\tau_A^k = \begin{cases} \tau_A^{Long}, & A^k < T_a; \\ \tau_A^{Short}, & \text{otherwise} \end{cases}$$

$$\tau_R^k = \begin{cases} \tau_R^{Short}, & A^k < T_a; \\ \tau_R^{Long}, & \text{otherwise;} \end{cases}$$

where $\tau_A^k$ and $\tau_R^k$ apply to all samples in the frame. Similarly, Equation 8 may be modified as $$\tau_A^k = \frac{\tau_A^{max}}{A^k},$$

-continued $$\tau_R^k = A^k \tau_R^{min}.$$

Additional Implementations.

Because the TCs change with each input sample, the exponential function of Equation 4 preferably is evaluated for both attack and release poles for each input sample. This amounts to a significant computational burden, especially for low-cost processors such as MCU and DSP. To avoid this problem, in certain embodiments the exponential function in Equation 4 is approximated by its truncated Taylor expansion. For example, the first-order expansion of Equation 4 is given by $$\alpha \approx 1 - \frac{1}{\tau f_s}$$

Plugging this equation into Equation 8, we have $$\alpha_A(n) = 1 - \frac{a(n)}{\tau^{max} f_s}$$

$$\alpha_R(n) = 1 - \frac{1}{a(n)\tau^{min} f_s}$$

For frame-based processing, attack and release poles are calculated only once for all samples in a frame, so the simplification above typically is less valuable.

The one-pole IIR filters in Equation 3 may also be simplified for the extreme case(s) of $$\tau_A^{Short}=0 \text{ and/or } \tau_R^{Long}=+\infty,$$

which occur(s) only when the DRC is in attack mode. Due to Equation 4, the two equations above result in $$\alpha_A^{Short}=0 \quad \text{Equation 19}$$

and $$\alpha_R^{Long}=1 \quad \text{Equation 20}$$

respectively.

If Equation 19 is used, the second part of Equation 3 reduces to $$Y_L=Y_1 \quad \text{Equation 21}$$

so the whole Equation 3 becomes $$Y_L(n)=\max(X_L(n),\alpha_R Y_L(n-1)+(1-\alpha_R)X_L(n)).$$

When switching from such an attack TC of zero to a non-zero TC, Equation 21 preferably is used to set the internal state $Y_1$ in Equation 3.

Similarly, if Equation 20 is used, the first part of Equation 3 is simplified to $$Y_1(n)=\max(X_L(n),Y_1(n-1)).$$

If both Equation 19 and Equation 20 are used, the whole Equation 3 may be simplified to $$Y_L(n)=\max(X_L(n),Y_L(n-1)).$$

Again, when switching from such an attack TC of zero to a non-zero TC, Equation 21 preferably is used to set the internal state $Y_1$ in Equation 3.

System Environment.

Generally speaking, except where clearly indicated otherwise, all of the systems, methods, modules, components, functionality and techniques described herein can be practiced with the use of one or more programmable general-purpose computing devices. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a cathode ray tube display, a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive or a solid-state drive); (11) a real-time clock; (12) a removable storage read/write device (such as a flash drive, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop, tablet or slate) computers and/or even smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

Additional Considerations.

Although the techniques of the present invention are described above as being applied to the audio signal as a whole, in alternate embodiments the audio signal is divided into multiple frequency bands, and any or all of such techniques are applied separately to one or more of such bands.

As used herein, the term "coupled", or any other form of the word, is intended to mean either directly connected or connected through one or more other elements or processing blocks, e.g., for the purpose of preprocessing. In the drawings and/or the discussions of them, where individual steps, modules or processing blocks are shown and/or discussed as being directly connected to each other, such connections should be understood as couplings, which may include additional steps, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein.

In the preceding discussion, the terms "operators", "operations", "functions" and similar terms refer to process steps or hardware components, depending upon the particular implementation/embodiment.

In the event of any conflict or inconsistency between the disclosure explicitly set forth herein or in the accompanying drawings, on the one hand, and any materials incorporated by reference herein, on the other, the present disclosure shall take precedence. In the event of any conflict or inconsistency between the disclosures of any applications or patents incorporated by reference herein, the disclosure most recently added or changed shall take precedence.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain methods are explained by breaking them down into steps listed in a particular order. Similarly, certain processing is performed by showing and describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently. For instance, in system 100 (shown in FIG. 2) a gain computer 114 precedes the level detector 116. However, in alternate embodiments the level detector 116 precedes the gain computer 114. More generally, one can define a larger adaptive gain-generation module 132 that includes the functionality of gain computer 114 (e.g., static gain compression) and level detector 116 (e.g., smoothing or lowpass filtering), potentially together with additional functionality (whether or not shown in FIG. 2), with such functionality arranged in a variety of different ways, as will be readily understood by those of ordinary skill in the art. For instance, as is well-known, operations that are linear and time-invariant typically can be arranged in any desired order.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

In the discussions above, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof as limited solely by the claims appended hereto.

What is claimed is:

1. A method of compressing the dynamic range of an audio signal, comprising:
   (a) obtaining an input audio signal;
   (b) providing a time-varying gain signal based on the input audio signal and a desired output range; and
   (c) applying the time-varying gain signal to the input audio signal to provide an output audio signal,
   wherein said step (b) includes: (i) determining and providing an indication of whether a sudden powerful burst of sound, referred to as a transient, is occurring in the input audio signal, (ii) providing an attack gain-response time and a release gain-response time based on the indication of whether the transient is occurring in the input audio signal, and (iii) lowpass filtering a signal that is based on the input audio signal, using the attack gain-response time and the release gain-response time as filtering parameters, and
   wherein the attack gain-response time is decreased and the release gain-response time is increased in response to a determination that the transient is occurring in the input audio signal.

2. A method according to claim 1, wherein the indication of whether the transient is occurring in the input audio signal indicates a measure of intensity of a detected transient.

3. A method according to claim 2, wherein the attack gain-response time decreases more and the release gain-response time increases more as a result of a larger measure of intensity of a detected transient.

4. A method according to claim 1, wherein the indication of whether the transient is occurring in the input audio signal is based on a crest factor detector that uses peak values.

5. A method according to claim 4, wherein the indication of whether the transient is occurring in the input audio signal also is based on a strength of the input audio signal in comparison to a specified threshold.

6. A method according to claim 1, wherein the indication of whether the transient is occurring in the input audio signal is based on a strength of the input audio signal in comparison to a specified threshold.

7. A method according to claim 1, wherein the indication of whether the transient is occurring in the input audio signal is calculated as an incremental value, by first determining preliminary attack values and then calculating the incremental value as an amount of change between a previous one of the preliminary attack values and a current one of the preliminary attack values.

8. A method according to claim 1, wherein the input audio signal is frame-based and the indication of whether the transient is occurring in the input audio signal is determined for individual frames of the input audio signal.

9. A method according to claim 1, wherein said step 1(b) also includes identifying gains to achieve a desired static range compression.

10. A method according to claim 1, wherein each of the attack gain-response time and the release gain-response time is an exponential time constant.

11. A method according to claim 1, wherein the attack gain-response time primarily controls how fast strength of the output audio signal is allowed to increase in response to a sudden increase in strength of the input audio signal, and the release gain-response time primarily controls how fast strength of the output audio signal is allowed to decrease in response to a sudden decrease in strength of the input audio signal.

12. A system for compressing the dynamic range of an audio signal, comprising:
   (a) a system input that accepts an input audio signal;
   (b) an adaptive gain-generation module having an input coupled to the system input and an output that provides a time-varying gain signal based on the input audio signal and a desired output range;
   (c) a multiplier having a first input coupled to the system input, a second input coupled to the output of the adaptive gain-generation module, and an output,
   wherein the adaptive gain-generation module includes a gain computer and a level detector having an input and an output,
   wherein the level detector includes: (i) an attack-detection module that determines and provides an indication of whether a sudden powerful burst of sound, referred to as a transient, is occurring in the input audio signal, (ii) a gain-response-time generator that provides an attack gain-response time and a release gain-response time based on the indication of whether the transient is occurring in the input audio signal that has been provided by the attack-detection module, and (iii) a filter that lowpass filters a signal that has been input into the level detector, using the attack gain-response time and the release gain-response time as filtering parameters, and
   wherein the gain-response-time generator shortens the attack gain-response time and increases the release gain-response time in response to the transient detection by the attack-detection module.

13. A system according to claim 12, wherein the indication of whether the transient is occurring in the input audio signal provided by the attack-detection module indicates a measure of intensity of a detected transient.

14. A system according to claim 13, wherein the attack gain-response time decreases more and the release gain-response time increases more as a result of a larger measure of intensity of a detected transient.

15. A system according to claim 12, wherein the indication of whether the transient is occurring in the input audio signal is based on a crest factor detector that uses peak values.

16. A system according to claim 15, wherein the indication of whether the transient is occurring in the input audio signal also is based on a strength of the input audio signal in comparison to a specified threshold.

17. A system according to claim 12, wherein the indication of whether the transient is occurring in the input audio signal is based on a strength of the input audio signal in comparison to a specified threshold.

18. A system according to claim 12, wherein the indication of whether the transient is occurring in the input audio signal is calculated as an incremental value, by first determining preliminary attack values and then calculating the incremental value as an amount of change between a previous one of the preliminary attack values and a current one of the preliminary attack values.

19. A system according to claim 12, wherein the gain computer identifies gains that produce a static range compression to accommodate the desired output range.

20. A system according to claim 12, wherein the attack gain-response time primarily controls how fast strength of the output audio signal is allowed to increase in response to a sudden increase in strength of the input audio signal, and the release gain-response time primarily controls how fast strength of the output audio signal is allowed to decrease in response to a sudden decrease in strength of the input audio signal.

* * * * *